United States Patent
Hales

(10) Patent No.: US 7,389,455 B2
(45) Date of Patent: Jun. 17, 2008

(54) REGISTER FILE INITIALIZATION TO PREVENT UNKNOWN OUTPUTS DURING TEST

(75) Inventor: Alan Hales, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 296 days.

(21) Appl. No.: 11/383,211

(22) Filed: May 14, 2006

(65) Prior Publication Data

US 2007/0061645 A1 Mar. 15, 2007

Related U.S. Application Data

(60) Provisional application No. 60/681,427, filed on May 16, 2005, provisional application No. 60/681,551, filed on May 16, 2005.

(51) Int. Cl.
*G01R 31/28* (2006.01)
(52) U.S. Cl. .................... 714/726; 714/30; 714/31; 714/36; 714/709; 714/724; 714/727; 714/729; 714/731; 714/733; 714/734; 712/227

(58) Field of Classification Search ............... None
See application file for complete search history.

(56) References Cited

U.S. PATENT DOCUMENTS

| | | | | | |
|---|---|---|---|---|---|
| 4,459,660 | A | * | 7/1984 | Bellay et al. | 711/1 |
| 4,567,593 | A | * | 1/1986 | Bashaw | 714/731 |
| 4,581,738 | A | * | 4/1986 | Miller et al. | 714/31 |
| 5,012,435 | A | * | 4/1991 | Bailey et al. | 714/55 |
| 5,467,358 | A | * | 11/1995 | Scarra | 714/729 |
| 5,555,423 | A | * | 9/1996 | Grochowski et al. | 712/229 |
| 5,668,817 | A | * | 9/1997 | Adham | 714/732 |
| 6,941,489 | B2 | * | 9/2005 | DeLano | 714/10 |

* cited by examiner

*Primary Examiner*—John P Trimmings
(74) *Attorney, Agent, or Firm*—Robert D. Marshall, Jr.; W. James Brady; Frederick J. Telecky, Jr.

(57) ABSTRACT

A system and method for initializing a register file during a test period for an integrated circuit, wherein the register file has one or more input ports. A counter, when enabled, is initialized and counts at each write cycle of the register file and outputs a current count value to the input ports of the register file to pre-load the register file to a known state.

20 Claims, 4 Drawing Sheets

REGISTER FILE INITIALIZATION TO PREVENT UNKNOWN OUTPUTS DURING TEST

RELATED APPLICATIONS

This application claims the benefit of Provisional Application Ser. No. 60/681,427 filed May 16, 2005, titled "Debugging Software-Controlled Cache Coherence," and Provisional Application Ser. No. 60/681,551, filed May 16, 2005, entitled, "Emulation/Debugging With Real-Time System Control", both of which are incorporated by reference herein as if reproduced in full below.

BACKGROUND

Moore's law, which is based on empirical observations, predicts that the speed of integrated circuits (IC's) doubles every eighteen months As a result, IC's with faster microprocessors and memory are often available for use in the latest electronic products every eighteen months. Although successive generations of IC's with greater functionality and features may be available every eighteen months, this does not mean that they can then be quickly incorporated into the latest electronic products In fact, one major hurdle in bringing electronic products to market is ensuring that the IC's, with their increased features and functionality, work as intended.

IC's are designed to operate in either a test mode or an operation mode, To facilitate the configuration of the IC in a test mode, test logic is embedded on the IC which exchanges data through test pins on the IC using a standard test interface such as Joint Testing Action Group (JTAG) or a real time data exchange (RTDX) type of interface developed by Texas instruments, Inc. This test logic is typically referred to as design-for-test (DFT) technology.

One such DFT technology is a scan design which creates one or more scan chains by serially tying together internal logic such as a set of registers and flip-flops in the IC. During the test mode of operation for the integrated circuit scan data is loaded into the internal logic of the IC through the test interface. After loading the test data, the IC is instructed to perform whatever operations would be caused by the scan data being loaded into the internal logic to create a scan signature. The scan signature is then read out from the test interface and compared with expected results to determine the operability of the IC. As the amount of internal logic has increased proportional to the increases predicted by Moore's Law, the size of scan chains and scan signatures has caused scan testing to become a lengthy and costly part of the IC development. As such, the development of scan compression DFT techniques has been used to shorten the amount of time testing takes and reduce the amount of data exchanged between testing equipment and an IC.

Uninitialized register files can cause a problem for DFT techniques that use scan compression because the output of the register file is not known. This unknown output value corrupts the signature that is calculated by the scan compression logic, thus invalidating the test.

Some testing equipment is very inefficient at masking and removing unknown values. Uninitialized register files can also cause a problem for this test equipment and can increase test time and in turn increase test costs.

SUMMARY

Disclosed herein is a system and method for initializing a register file during a test period for an integrated circuit, wherein the register file has one or more input ports. A counter, when enabled, is initialized and counts the write cycles of the register file and outputs a current count value to the one or more input ports of the register file. As such, a known value is written into each address location of the register file.

DETAILED DESCRIPTION

Figure 1:
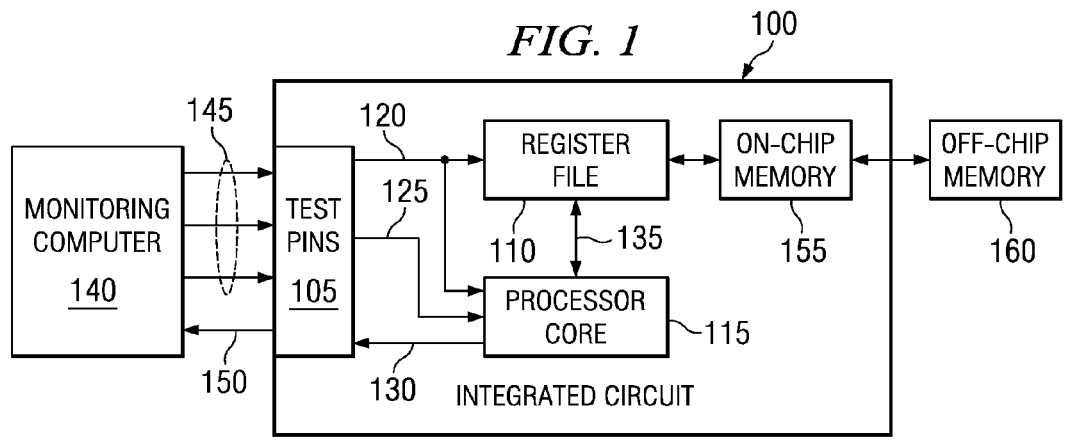
FIG. 1 depicts an example of a system for testing an integrated circuit (IC).

FIG. 1 discloses an exemplary integrated circuit (IC) 100 that is to be tested by a monitoring computer 140. Monitoring computer 140 outputs various control signals 145 to IC 100 through test pins 105 and receives output 150 from the IC. Based on the values received from output 150 a determination can be made as to whether or not the IC 100 is working as intended IC 100 may comprise a register file 110, a processor core 115, and a memory 155. Processor core 115 may have a plurality of functional units for manipulating data in a desired manner based on instructions that are input to the processor core 115. Register file 110 may be an array of processor registers used by processor core 115 to stage data and instructions between memory 155 and the functional units of processor core 115. The interactions between processor core 115 and register file 110 may take place through a data and communications bus 135. Memory 155 may be a cache memory of one or more levels which may further access off-chip memory 160 to fetch any data or instructions not presently stored in memory 155 or store any data or instructions which do not fit in memory 155 any more. Memory 160 may be a random access memory (RAM), hard disk drive, or any other suitable storage device.

Within IC 100 test pins 105 may provide an input 120 to a register file 110 and processor core 115 to select the operation of IC 100 between a normal mode and a test mode. In a normal mode of operation the register file 110 is placed under the control of processor core 115 and all other test pins not corresponding to input 120 are ignored. Once an IC 100 is working as intended, the IC 100 may be placed in an electronic product and the test pin corresponding to input 120 may be permanently hardwired in the electronic product such that the IC 100 is always in the normal mode of operation. Monitoring computer 140 may provide a signal to a test pin 105 corresponding to input 120 to place the IC 100 in a test mode In a test mode of operation the register file 110 is initialized while scan data is loaded into one or more scan chains of processor core 115 through input 125. The initialization of register file 110 may be accomplished by writing known values to all or most of the memory locations in register file 110. Once the scan data is loaded into the one or more scan chains, processor core 115 operates as dictated by the scan data. Throughout this operation the processor core 115 may interact with the register file 110. The resultant states of the scan chains are shifted out to the monitoring computer 140 through outputs 130 and 150. The values input to monitoring computer 140 through output 150 are compared to expected values to determine whether or not IC 100 is working as intended.

Figure 2:
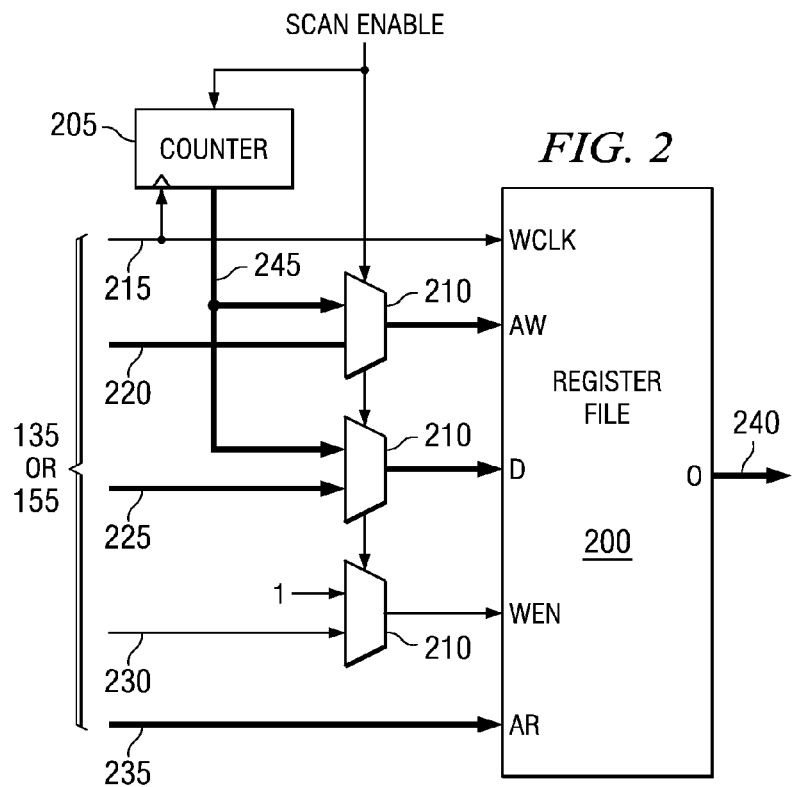
FIG. 2 depicts an example of a register file which can be loaded with known values for testing.

FIG. 2 discloses an exemplary embodiment of register file 110 comprising a register file 200, counter 205, and selection logic 210. Register file 200 has write clock (WCLK), address write (AW), data (D), write enable (WEN), and address read (AR) inputs and an output (O). The WCLK input may be a single bit line clock input used to time the writing of data to register file 200, Data held on a data bus at the D input is written to the address present on an address bus at the AW input. The single bit line WEN input enables the writing of data at the D input to the address at the AW input. The data output at the O output to bus 240 comprises data read from the address held on an address bus at the AR input. Input 215 may provide a single bit clock signal, input 220 may provide a write address from an address bus, input 225 may provide a data value from a data bus, input 230 may provide a single bit write enable signal, input 235 may provide a read address from an address bus, and output 240 may provide a data output to a data bus. Inputs 215, 220, 230, and 235 may be provided from processor core 115 through data and communications bus 135. Input 225 may be provided from either the processor core 115 or the memory 155 and output 240 may be provided to either the processor core 115 or the memory 155.

Selection logic 210 comprises one or more multiplexers (mux's), or any other selection logic, to select between inputs for testing or for normal operation of the register file 200 based on the value of a Scan Enable signal. The Scan Enable signal may be provided through test input 120 in FIG. 1 and is asserted for the duration of loading scan data into a scan chain in processor core 115. When the Scan Enable signal is low the selection logic 210 preferably selects inputs for normal operation. As such, selection logic 210 would select inputs 220, 225, and 230 for the AW, D, and WEN register file inputs respectively In the normal mode of operation, the low Scan Enable signal also disables the operation of counter 205.

Figure 4:
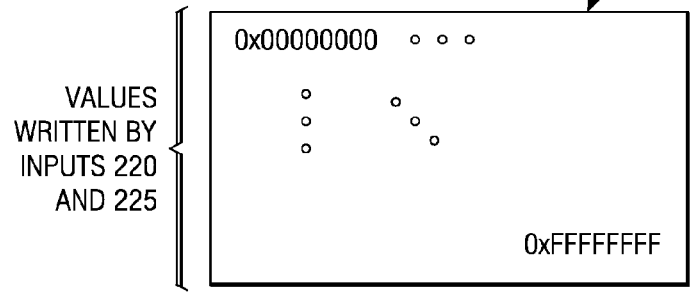
FIG. 4 depicts values that may be written into the register file of FIG. 2.

When the Scan Enable signal is high, counter 205 is enabled to operate and is initialized, for example to a zero count value, and preferably begins counting up. Counter 205 is synchronized to the WCLK input of register file 200 and, as such, for each clock cycle on the WCLK input the counter 205 preferably counts up once. Also, the WCLK input may be synchronized with the input of scan data into scan chains of processor core 115 such that as each piece of scan data is loaded into a scan chain, the clock signal on the WCLK input may cycle once. When the Scan Enable signal is high, the selection logic 210 preferably selects the counter output bus 245 for the AW and D inputs, and a hard-wired high signal, for example "1", for the WEN input for register file 200. As such, the register file 200 is enabled to write for the duration that the Scan Enable signal is high. The value held on the D input is written to the address held on the AW input each clock cycle of the clock provided by the WCLK input. Since the value on the D input is the same as the value on the AW input, which is the value held on the counter output bus 245 by counter 205, if the counter counts through the entire address range of the register file 200, then the value of each address is written into each address location in the register file 200. As such, known values are provided to register file 200 for testing. For example, if counter 205 is initialized by the Scan Enable signal to a zero value and counts up, then a value of 0x00000000 is written into address location 0x00000000, a value of 0x00000001 is written into address location 0x00000001, all the way up to a value of 0xFFFFFFFF being written into address location 0xFFFFFFFF in register file 200 as shown in FIG. 4. Since the Scan Enable signal is asserted for the duration of loading scan data into a scan chain in processor core 115, then as long as the longest scan chain is at least as long as the full address range of register file 200, every location in the register file 200 would have a known value.

It is noted that while the above description was made with regard to the Scan Enable signal being a particular polarity, ire., high or low, in order to accomplish a particular task, this is not limiting. For instance, when the Scan Enable signal is high the selection logic 210 may select inputs for normal operation as opposed to selecting the output of the counter 205 for inputs AW and D and the high signal for the WEN input, as was the case in the above description. Also, counter 205 does not have to be initialized to a zero value and count up, but may also be initialized to a very high value, such as the highest address value of register file 200, and count down.

Figure 3:
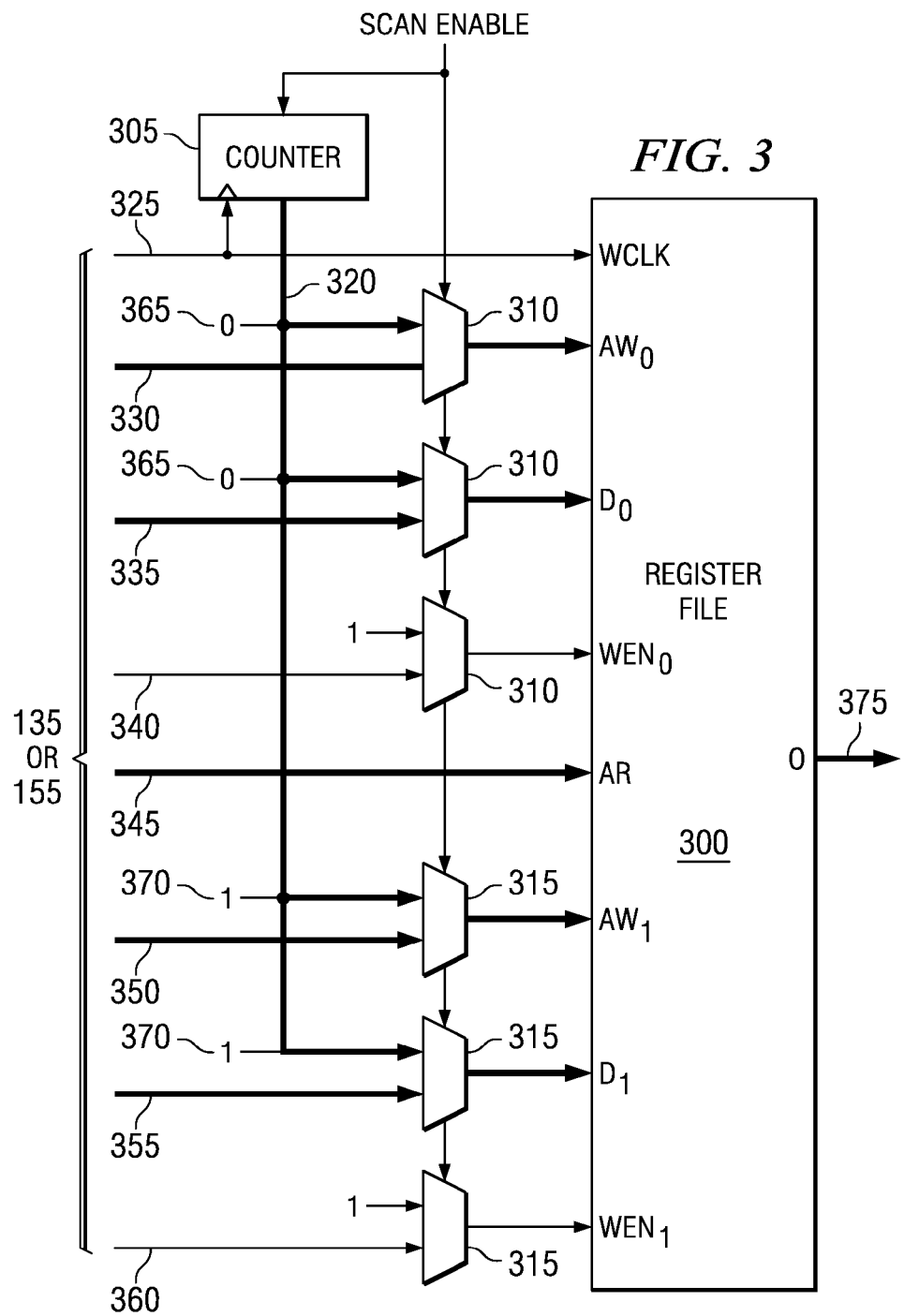
FIG. 3 depicts an example of a register file with two write ports which can be loaded with known values for testing.

If a register file has an address range that exceeds the length of the longest scan chain and the register file has multiple write ports a solution is provided below with regards to FIG. 3. FIG. 3 shows an exemplary embodiment of register file 110 comprising a register file 300, counter 305, and selection logic 310 and 315. In this embodiment register file 300 has two write ports with inputs $AW_0$, $D_0$, and $WEN_0$ comprising the first write port and inputs $AW_1$, $D_1$, and $WEN_1$ comprising the second write port. The remaining inputs and output are similar to those described with regard to FIG. 2. In particular, inputs 325 and 345 and output 375 of FIG. 3 correspond to inputs 215 and 235 and output 240 of FIG. 2 respectively. Further, each of inputs 330-340 and 350-360 correspond to inputs 220-230 of FIG. 2 respectively. As such, inputs 325, 330, 340-350, and 360 may be provided from processor core 115 through data and communications bus 135. Inputs 335 and 355 may be provided from either the processor core 115 or the memory 155 and output 375 may be provided to either the processor core 115 or the memory 155.

Selection logic 310 and 315 each comprise one or more multiplexers (mux's), or any other selection logic, to select inputs for each write port between inputs for testing or normal operation of the register file 300 based on the value of a Scan Enable signal. The Scan Enable signal may be provided through test input 120 in FIG. 1 and is asserted for the duration of loading scan data into a scan chain in processor core 115. When the Scan Enable signal is low, selection logic 310 and 315 preferably select inputs for normal operation. As such, selection logic 310 would select inputs 330, 335, and 340 for the $AW_0$, $D_0$, and $WEN_0$ inputs respectively for the first write port of register file 300, Selection logic 315 would select inputs 350, 355, and 360 for the $AW_1$, $D_1$, and $WEN_1$ inputs respectively for the second write port of register file 300, In the normal mode of operation, the low Scan Enable signal also disables the operation of counter 305.

When the Scan Enable signal is high, counter 305 is enabled to operate and is initialized, for example to a zero count value, and preferably begins counting up. Counter 305 is synchronized to the WCLK input of register file 300 and, as such, for each cycle of the WCLK input the counter 305 preferably counts up once. Also, the WCLK input may be synchronized with the input of scan data into scan chains of processor core 115 such that as each piece of scan data is loaded into a scan chain, the clock signal on the WOCLK input may cycle once. When the Scan Enable signal is high, the selection logic 310 and 315 preferably selects the counter output bus 320 for the $AW_0$, $AW_1$, $D_0$, and $D_1$ and a hardwired high signal, for example "1", for the $WEN_0$ and $WEN_1$ inputs for register file 300. Further note that for the first write port the most significant bit of the counter output bus 320 is hardwired to a low value 365, for example "0", and for the second write port the most significant bit of the counter output bus 320 is hardwired to a high value 370, for example "1".

For the first write port the register file 300 is enabled to write for the duration that the Scan Enable signal is high. The value held on the $D_0$ input is written to the address held on the $AW_0$ input each clock cycle of the clock provided by the WCLK input. Since the value on the $D_0$ input is the same as the value on the $AW_0$ input, which is the value held on the counter output bus 320 by counter 305 with the most significant bit of the counter output bus 320 held low, if the counter 305 counts through half of the address range of the register file 300, then the value of each address is written into each address location in the first half of register file 300. As such, known register file values for the first half of register file 300 are provided for testing. For example, if counter 305 is initialized by the Scan Enable signal to a zero value and counts up, then a value of 0x00000000 is written into address location 0x00000000, a value of 0x00000000 is written into address location 0x00000001, all the way up to a value of 0x7FFFFFFF being written into address location 0x7FFFFFFF in register file 300 as shown in FIG. 5

For the second write port the register file 300 is similarly enabled to write for the duration that the Scan Enable signal is high and the value held on the $D_1$ input is written to the address held on the $AW_1$ input each clock cycle of the clock provided by the WCLK input. Since the value on the $D_1$ input is the same as the value on the $AW_1$ input, which is the value held on the counter output bus 320 by counter 305 with the most significant bit of counter output bus 320 held high, if the counter 305 counts through half of the address range of the register file 300, then the value of each address is written into each address location in the second half of register file 300. As such, known register file values for the second half of register file 300 are provided for testing. For example, if counter 305 is initialized by the Scan Enable signal to a zero value and counts up, then a value of 0x80000000 is written into address location 0x80000000, a value of 0x80000001 is written into address location 0x80000001, all the way up to a value of 0xFFFFFFFF being written into address location 0xFFFFFFFF in register file 300 as shown in FIG. 5.

Since the Scan Enable signal is asserted for the duration of loading scan data into a scan chain in processor core 115, then as long as the longest scan chain is at least as long as it takes counter 305 to count half of the address range of register file 300, every location in the register file 300 would have a known input.

Figure 5:
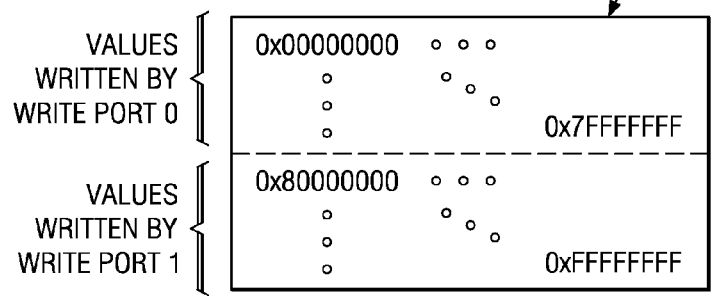
FIG. 5 depicts values that may be written into the register file of FIG. 3.

FIG. 5 depicts the values that would be written into register file 300. If register file 300 comprised a 32-bit memory, then the first write port would write values 0x80000000 through 0x7FFFFFFF into address locations 0x00000000 through 0x7FFFFFFF. The second write port would write values 0x80000000 through 0xFFFFFFFF into address locations 0x80000000 through 0xFFFFFFFF. As such, every location in register file 300 would have a known value.

It is noted that while the above description was made with regard to the Scan Enable signal being a particular polarity, ie., high or low, in order to accomplish a particular task, this is not limiting. For instance, when the Scan Enable signal is high the selection logic 310 and 315 may select inputs for normal operation as opposed to selecting the output of the counter 305 for inputs $AW_0$, $AW_1$, $D_0$, and $D_1$, and the high signal for inputs $WEN_0$ and $WEN_1$ as was the case in the above description. Also, counter 305 does not have to be initialized to a zero value and count up, but may also be initialized to a very high value, such as half of the highest address value of register file 300, and count down.

Figure 6:
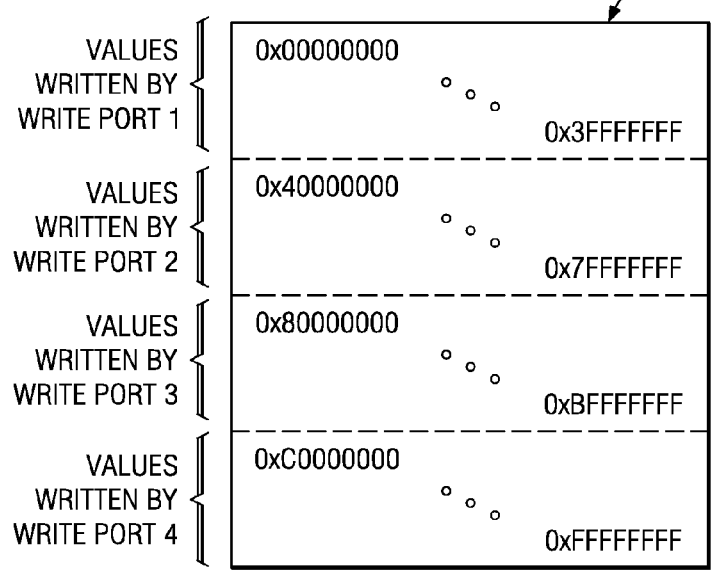
FIG. 6 depicts values that may be written into a register file with four write ports.

It is noted that register file 300 may have more than two write ports, wherein hard wired values for the most significant bits of the counter output bus 320 would count through each of the write ports. For example, if there were four write ports then the two most significant bits of the counter output bus 320 would be hard wired to count through each write port and the counter 305 would count through the remaining values in the address. In particular, a first write port would have a "00" input hardwired on the two most significant bits of the counter output bus 320, a second write port would have a "01" input hardwired on the two most significant bits of the counter output bus 320, a third write port would have a "10" input hardwired on the two most significant bits of the counter output bus 320, and a fourth write port would have a "11" input hardwired on the two most significant bits of the counter output bus 320. FIG. 6 depicts the values that may be written into a register file with four write ports. In this case, counter 305 would only need to count through a quarter of the address range of register file 300. Since the Scan Enable signal is asserted for the duration of loading scan data into a scan chain in processor core 115, then as long as the longest scan chain is at least as long as it takes counter 305 to count a quarter of the full address range of register file 300, every location in the register file 300 would have a known input.

It is further noted that register file 300 may have a number of write ports that is not a multiple of two. In this case combinational logic may be used to evenly divide the entire address range of register file 300 between each of the write ports. The combinational logic may provide a variable number on the most significant bits of counter output bus 320 to each write port. For example, if there are three write ports then the two most significant bits of the counter output bus 320 would have variable values on each of the write ports so as to ensure the entire address range of the register file 300 is counted to write known values into each memory location of register file 300.

Figure 7:
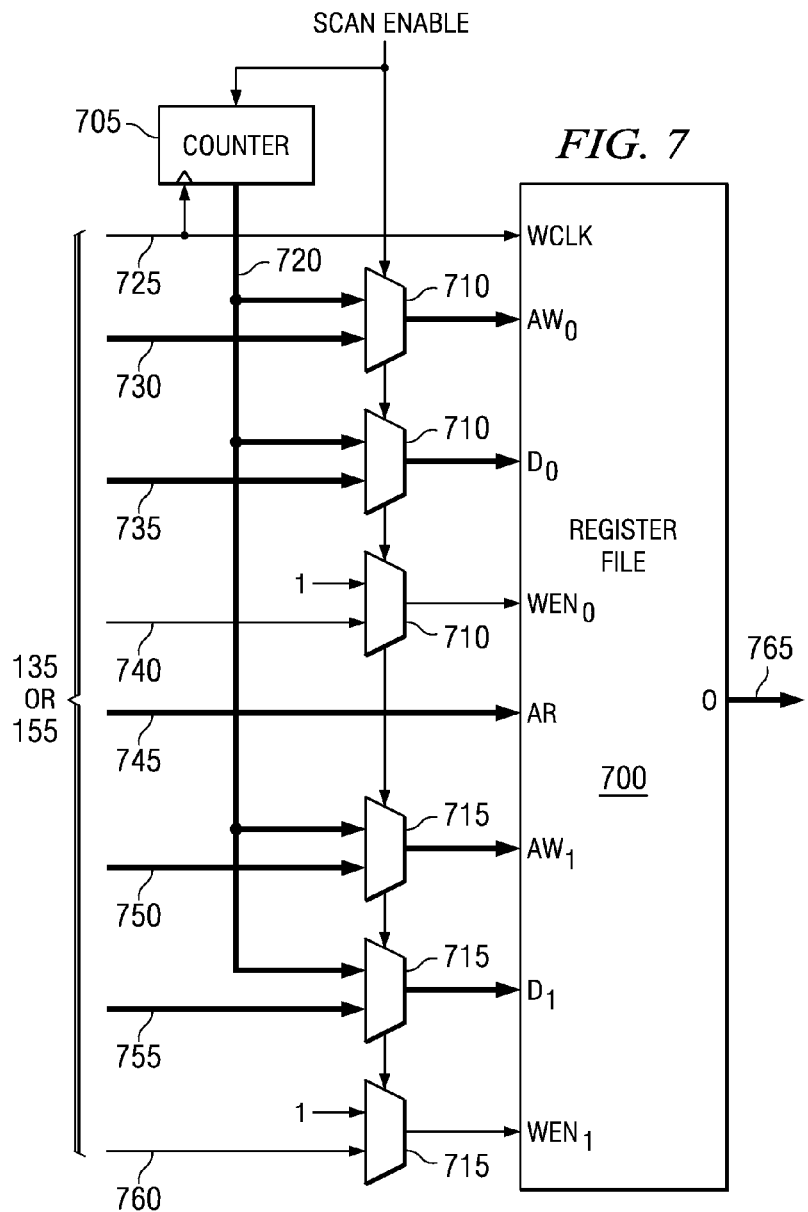
FIG. 7 depicts an example of a register file with two write ports that write to mutually exclusive portions of a register file and can be loaded with known values for testing.

In an alternative embodiment, if a register file has an address range that exceeds the length of the longest scan chain and the register file has multiple write ports a solution is provided below with regards to FIG. 7. The solution illustrated in FIG. 7 is different from that shown in FIG. 3 in that each write port writes to mutually exclusive portions of register file 700. In particular, FIG. 7 shows an exemplary embodiment of register file 110 comprising a register file 700, counter 705, and selection logic 710 and 715. In this embodiment register file 700 has two write ports with inputs $AW_0$, $D_0$, and $WEN_0$ comprising the first write port and inputs $AW_1$, $D_1$, and $WEN_1$ comprising the second write port. The remaining inputs and output are similar to those described with regard to FIG. 2 In particular, inputs 725 and 745 and output 765 of FIG. 7 correspond to inputs 215 and 235 and output 240 of FIG. 2 respectively. Further, each of inputs 730-740 and 750-760 correspond to inputs 220-230 of FIG. 2 respectively. As such, inputs 725, 730, 740-750, and 760 may be provided from processor core 115 through data and communications bus 135. inputs 735 and 755 may be provided from either the processor core 115 or the memory 155, and output 765 may be provided to either the processor core 115 or the memory 155.

Selection logic 710 and 715 each comprise one or more multiplexers (mux's), or any other selection logic, to select inputs for each write port between inputs for testing or normal operation of the register file 700 based on the value of a Scan Enable signal. The Scan Enable signal may be provided through test input 120 in FIG. 1 and is asserted for the duration of loading scan data into a scan chain in processor core 115. When the Scan Enable signal is low, selection logic 710 and 715 preferably select inputs for normal operation. As such, selection logic 710 would select inputs 730, 735, and 740 for the $AW_0$, $D_0$, and $WEN_0$ inputs respectively for the first write port of register file 700. Selection logic 715 would select inputs 750, 755, and 760 for the $AW_1$, $D_1$, and $WEN_1$ inputs respectively for the second write port of register file 700. In the normal mode of operation, the low Scan Enable signal also disables the operation of counter 305.

When the Scan Enable signal is high, counter 705 is enabled to operate and is initialized, for example to a zero count value, and preferably begins counting up. Counter 705 is synchronized to the WCLK input of register file 700 and, as such, for each cycle of the WCLK input the counter 705 preferably counts up once. Also, the WCLK input may be synchronized with the input of scan data into scan chains of processor core 115 such that as each piece of scan data is loaded into a scan chain, the clock signal on the WCLK input may cycle once. When the Scan Enable signal is high, the selection logic 710 and 715 preferably selects the counter output bus 720 for the $AW_0$, $AW_1$, $D_0$, and $D_1$ and a hard-wired high signal, for example "1", for the $WEN_0$ and $WEN_1$ inputs for register file 700. Since each write port writes to a mutually exclusive portion of the register file 700, none of the bits in the counter output bus 720 need to be hardwired with a high or low value. In other words, the values held on counter output bus 720 are exclusively provided by counter 705.

For the first write port the register file 700 is enabled to write for the duration that the Scan Enable signal is high. The value held on the $D_0$ input is written to the address held on the $AW_0$ input each clock cycle of the clock provided by the WCLK input. Since the value on the $D_0$ input is the same as the value on the $AW_0$ input, which is the value held on the counter output bus 720 by counter 705, if the counter 705 counts through the full address range of the first write port, then the value of each address is written into each address location in the portion of register file 700 corresponding to the first write port. As such, known register file values for the portion of register file 700 corresponding to the first write port are provided for testing. For example, if counter 705 is initialized by the Scan Enable signal to a zero value and counts up as long, then a value of 0x00000000 is written into address location 0x00000000 of the first write port, a value of 0x00000001 is written into address location 0x00000001 of the first write port, all the way up to a value of 0xFFFFFFFF being written into address location 0xFFFFFFFF of the first write port in register file 700 as shown in FIG. 8.

For the second write port the register file 700 is similarly enabled to write for the duration that the Scan Enable signal is high The value held on the $D_0$ input is written to the address held on the $AW_0$ input each clock cycle of the clock provided by the WCLK input. Since the value on the $D_0$ input is the same as the value on the $AW_0$ input, which is the value held on the counter output bus 720 by counter 705, if the counter 705 counts through the full address range of the second write port, then the value of each address is written into each address location in the portion of register file 700 corresponding to the second write port. As such, known register file values for the portion of register file 700 corresponding to the second write port are provided for testing. For example, if counter 705 is initialized by the Scan Enable signal to a zero value and counts up, then a value of 0x00000000 is written into address location 0x00000000 of the second write port, then a value of 0x00000001 is written into address location 0x00000001 of the second write port, all the way up to a value of 0xFFFFFFFF being written into address location 0xFFFFFFFF of the second write port in register file 700 as shown in FIG. 8

Since the Scan Enable signal is asserted for the duration of loading scan data into a scan chain in processor core 115, then as long as the longest scan chain is at least as long as it takes counter 705 to count the full address range of each write port of register file 700, every location in the register file 700 would have a known input.

Figure 8:
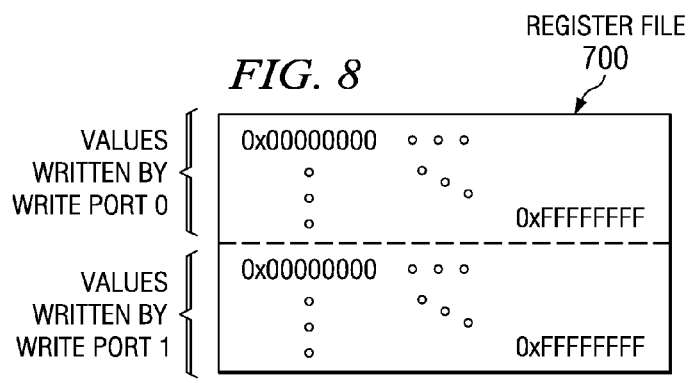
FIG. 8 depicts values that may be written into the register file of FIG. 7.

FIG. 8 depicts the values that would be written into register file 700. If each write port of register file 700 writes to a 32-bit portion of register file 700, then the first write port would write values 0x00000000 through 0xFFFFFFFF into address locations 0x00000000 through 0xFFFFFFFF of the first write port. The second write port would write values 0x00000000 through 0xFFFFFFFF into address locations 0x00000000 through 0xFFFFFFFF of the second write port. As such, every location in the register file 700 would have a known value.

It is noted that while the above description was made with regard to the Scan Enable signal being a particular polarity, i.e., high or low, in order to accomplish a particular task, this is not limiting. For instance, when the Scan Enable signal is high the selection logic 710 and 715 may select inputs for normal operation as opposed to selecting the output of the counter 705 for inputs $AW_0$, $D_0$, $AW_1$, and $D_1$ and the high signal for the $WEN_0$ and $WEN_1$ inputs as was the case in the above description. Also, counter 705 does not have to be initialized to a zero value and count up, but may also be initialized to a very high value, such as the highest address value of each write port of register file 700, and count down.

It is noted that register file 700 may have more than two write ports, wherein for each additional write port the counter output bus 720 would simply be input to selection logic for each addition write port.

As such, disclosed above is a system and method for placing known values into a register file while loading scan data into a scan chain, This enables the use of scan compression without needing to mask and remove unknown values which reduces test time and in turn reduces test costs. It also enables the real paths to and from the register file to be tested. Preferably, the embodiments disclosed above avoid using a mux, with its associated delay and size, to bypass the register file.

While various system and method embodiments have been shown and described herein, it should be understood that the disclosed systems and methods may be embodied in many other specific forms without departing from the spirit or scope of the invention The present examples are to be considered as illustrative and not restrictive. The intention is not to be limited to the details given herein, but may be modified within the scope of the appended claims along with their full scope of equivalents.

What is claimed is:

1. A system comprising:
   a register file with one or more input ports; and
   a counter that counts write cycles of the register file and outputs a current count value;
   wherein, when said counter is enabled, said count value is initialized and said input ports are coupled to said counter output to pre-load the register file to a known state.

2. The system of claim 1, wherein:
   each of said input ports comprises an address input and a data input.

3. The system of claim 2, wherein:
when said counter is not enabled, said address and data inputs are coupled to one or more address and data lines, respectively.

4. The system of claim 1, wherein:
a write enable signal is input to said register file for the entire duration said counter is enabled.

5. The system of claim 1, wherein:
said register file and said counter are embedded within an integrated circuit; and
said counter is enabled during a testing period for said integrated circuit.

6. The system of claim 5, wherein:
said testing period is a period during which scan data is loaded into a scan chain of said integrated circuit.

7. The system of claim 1, wherein:
if said register file has more than one input port, a number of most significant bits for each input port are coupled to a predetermined value.

8. The system of claim 7, wherein:
said number of most significant bits are coupled to a different predetermined value for each input port.

9. The system of claim 8, wherein:
if the number of input ports is a multiple of two, said predetermined value is equal to a binary equivalent of the corresponding port number.

10. The system of claim 7, wherein:
said number of most significant bits is equal to the number of bits necessary to represent the number of input ports as a binary number.

11. A method for initializing a register file comprising:
enabling a counter that counts write cycles of a register file and outputs a current count value;
initializing said count value and coupling one or more input ports of said register file to said counter output when said counter is enabled to pre-load the register file to a known state.

12. The method of claim 11, wherein:
each of said input ports comprises an address input and a data input.

13. The method of claim 12, further comprising:
coupling said address and data inputs to one or more address and data lines respectively, when said counter is not enabled.

14. The method of claim 11, further comprising:
inputting a write enable signal is to said register file for the entire duration said counter is enabled.

15. The method of claim 11, further comprising:
enabling said counter during a testing period for an integrated circuit.

16. The method of claim 15, wherein:
said testing period is a period during which scan data is loaded into a scan chain of said integrated circuit.

17. The method of claim 11, further comprising:
coupling a number of most significant bits for each input port to a predetermined value if said register file has more than one input port.

18. The method of claim 17, further comprising:
coupling said number of most significant bits to a different predetermined value for each input port.

19. The method of claim 18, further comprising:
inputting said predetermined value as a binary equivalent of the corresponding port number if the number of input ports is a multiple of two.

20. The method of claim 17, further comprising:
providing said predetermined value to said number of most significant bits equal to the number of bits necessary to represent the number of input ports as a binary number.

* * * * *